United States Patent [19]
Corbett et al.

[11] Patent Number: 5,307,142
[45] Date of Patent: Apr. 26, 1994

[54] HIGH PERFORMANCE STATIC LATCHES WITH COMPLETE SINGLE EVENT UPSET IMMUNITY

[75] Inventors: Wayne T. Corbett; Harry T. Weaver, both of Albuquerque, N. Mex.

[73] Assignee: The United States of America as represented by the United States Department of Energy, Washington, D.C.

[21] Appl. No.: 793,084

[22] Filed: Nov. 15, 1991

[51] Int. Cl.$^5$ .................... G11C 11/00; G11C 29/00
[52] U.S. Cl. ............................ 365/156; 365/154; 365/200; 371/10.3
[58] Field of Search ............... 365/154, 156, 200, 201, 365/208; 371/10.3

[56] References Cited

U.S. PATENT DOCUMENTS

| | | | |
|---|---|---|---|
| 4,053,873 | 10/1977 | Freeman et al. | 365/205 |
| 4,460,998 | 7/1984 | Yamada et al. | 371/10.3 |
| 4,744,056 | 5/1988 | Yu et al. | 365/154 |
| 4,748,594 | 5/1988 | Iida | 365/200 |
| 4,797,804 | 1/1989 | Rockett, Jr. | 365/154 |
| 4,805,148 | 2/1989 | Diehl-Nagle et al. | 365/154 |
| 4,809,226 | 2/1989 | Ochoa, Jr. | 365/156 |
| 4,852,060 | 7/1989 | Rockett, Jr. | 365/154 |
| 4,912,675 | 3/1990 | Blake et al. | 365/154 |
| 4,914,629 | 4/1990 | Blake et al. | 365/154 |
| 4,956,814 | 9/1990 | Houston | 365/154 |
| 4,956,815 | 9/1990 | Houston | 365/154 |
| 4,969,125 | 11/1990 | Ciraula et al. | 365/203 |
| 5,046,044 | 9/1991 | Houston et al. | 365/156 |
| 5,051,949 | 9/1991 | Young | 365/156 |
| 5,053,848 | 10/1991 | Houston et al. | 365/154 |
| 5,134,581 | 7/1992 | Ishibashi et al. | 365/156 |

OTHER PUBLICATIONS

T. M. Mnich et al., "Comparison of Analytical Models and Experimental Results for Single Event Upset in CMOS SRAMs," *IEEE Transactions on Nuclear Science*, vol. NS-30, No. 6, Dec. 1983 pp. 4620-4623.

A. Ochoa, Jr. et al., "A Proposed New Structure for SEU Immunity in SRAM Employing Drain Resistance," *IEEE Electron Device Letters* vol. EDL-8, No. 11, Nov. 1987, pp. 537-539.

L. Rockett, Jr., "An SEU-Hardened CMOS Data Latch Design," *IEEE Transactions on Nuclear Science*, vol. 35, No. 6, Dec., 1988 pp. 1682-1687.

L. Rockett, Jr., "Designing Hardened Bulk/Epi CMOS Circuits," *Proceedings of the IEEE*, vol. 76, No. 11, Nov., 1988, pp. 1474-1483.

J. Pridmore, "Designing Hardened CMOS/SOS Circuits," *Proceedings of the IEEE*, vol. 76, No. 11, Nov. 1988, pp. 1483-1490.

H. Weaver et al., "An SEU Tolerant Memory Cell Derived from Fundamental Studies of SEU Mechanisms in SRAM," *IEEE Transactions on Nuclear Science*, vol. NS-34, 1987, p. 1281.

*Primary Examiner*—Eugene R. LaRoche
*Assistant Examiner*—Michael C. Kessell
*Attorney, Agent, or Firm*—Kacuna Ojanen; James H. Chafin; William R. Moser

[57] ABSTRACT

An asymmetric response latch providing immunity to single event upset without loss of speed. The latch has cross-coupled inverters having a hardened logic state and a soft state, wherein the logic state of the first inverter can only be changed when the voltage on the coupling node of that inverter is low and the logic state of the second inverter can only be changed when the coupling of that inverter is high. One of more of the asymmetric response latches may be configured into a memory cell having complete immunity, which protects information rather than logic states.

9 Claims, 3 Drawing Sheets

HIGH PERFORMANCE STATIC LATCHES WITH COMPLETE SINGLE EVENT UPSET IMMUNITY

The United states Government has rights in this invention pursuant to Contract No. DE-AC04-76DP00789 between the Department of Energy and American Telephone & Telegraph Company.

BACKGROUND OF THE INVENTION

Integrated circuit logic states are maintained by virtue of specific transistor combinations being either conducting or nonconducting. High energy ion strikes on the microcircuit generate photocurrents whose primary detrimental effect is to make transistors in the nonconducting or OFF state appear to be conducting or ON, thereby confusing the logic state and leading to single event upset (SEU). Protection against these soft errors is accomplished using either technology or circuit techniques, both of which generally impact yield and performance relative to unhardened circuits. Effective SEU hardening is accomplished generically in three ways: (1) error correction; (2) circuit techniques; and (3) technology modifications.

Error correction techniques are logic operations which are spatially removed from the latch, either on or off chip. The most popular technique is the Hamming code as in J. S. Pridmore, "Designing Hardened CMOS/SOS Circuits", PROCEEDINGS OF THE IEEE, Vol. 76, 1483 (1988), where seven bits are needed to correct four bits. Thus, an area penalty of about thirty percent on the chip and a speed penalty of about fifty percent are imposed when the error correction technique is used.

Circuit techniques are generally designed to stiffen the struck node and prevent node transients or prevent their propagation within the latch. A typical example is given by L. R. Rockett, "An SEU-Hardened CMOS Data Latch Design", IEEE TRANS. NUCL. SCI., NS-35, 1682 (1988), and in L. R. Rockett, "Designing Hardened Bulk/Epi CMOS Circuits", PROCEEDINGS OF THE IEEE, 1474 (1988), which papers demonstrate this type protection. Although significant practical improvement results from these circuit techniques, the circuit is not completely hardened because a sufficiently large ion strike may actually upset the cell.

Examples of technology modification techniques to accomplish SEU hardening have been discussed in Weaver et. al., "An SEU Tolerant Memory Cell Derived from Fundamental Studies of SEU Mechanisms in SRAM", IEEE TRANS. NUCL. SCI., NS-34, 1281 (1987). Resistors are placed in the memory cell "write" path to slow the cell response to allow circuit recovery before the upset signal is latched in. Designing the memory cell so that the write time is longer than the ion-induced photocurrent transients eliminates spurious writing, thereby inhibiting SEU. Alternatively, resistors may be placed in the drain lines to divide the voltage transients at feedback points resulting for strikes on the p-channel transistors. Properly choosing these drain resistors can completely protect the unstruck inverter by never allowing the gate voltage to be sufficient to switch. Ion induced transients that pose a threat to logic occur primarily at the drains of OFF transistors because photocurrents are always directed to reinforce the ON transistor node voltage. There is one exception to this condition that occurs when an ON transistor is located in a well or tub, i.e., n-channel transistor of a p-well technology. In this case, upsets can be produced with very high energy ions, but the probability of such an occurrence is rare and often neglected. Although addition of diodes has been proposed to harden cells, the only effective technology thus far is the use of resistors. There are many practical problems to the technology approach and there is some question about its viability at very high integration levels. Speed is affected and total immunity is not always possible. Testing of the individual cells is also not possible. Examples of these techniques are set forth in U.S. Pat. No. 4,914,629 entitled "Memory Cell Including Single Event Upset Rate Reduction Circuitry," to Blake et al., Apr. 3, 1990; and in U.S. Pat. No. 4,956,814, entitled "Memory Cell with Improved Single Event Upset Rate Reduction Circuitry," to Houston, Sep. 11, 1990.

One resistor technique in U.S. Pat. No. 4,809,226, entitled "Random Access Memory Immune to Single Event Upset Using a T-Resistor," to Ochoa, Feb. 28, 1989, and in Ochoa et al., "A Proposed New Structure for SEU Immunity in SRAM Employing Drain Resistance", IEEE ELEC. DEV. LETT., ELD-8, 537 (1987), uses much smaller resistors than conventionally connected between inverters. Ochoa uses resistors to protect the most sensitive node, i.e., the drain of the OFF p-channel transistor is protected by placing a resistor between it and the information node. However, to completely protect against ion strikes on transistors within wells, a second set of resistors is required.

It is thus an object of the invention to provide a memory latch with an asymmetric response to an SEU resulting from an ion strike. This object is achieved with the implementation of two cross-coupled inverters, wherein the coupling or feedback node of each inverter is electrically connected to the gate of the other inverter, and wherein a voltage dividing device is placed between the p-channel and the n-channel transistors of each inverter. An advantage of this arrangement is that because one logic state is hardened, ion strikes affect only the other logic state. Thus, the invention protects one logic state while allowing SEU when in the other state, thereby providing an asymmetric response. The use of these impedance elements is a fundamentally different use of prior art voltage division mechanisms.

It is yet another object of the invention to provide for complete immunity from SEU in a memory cell. This object is achieved by the implementation of asymmetric latches having one hardened logic state as stated above in a parallel configuration to provide for redundancy. Thus, the logic state of each latch can be interrogated, and with an AND gate, upsets can be corrected.

It is yet another object of the invention to provide for a memory cell completely immune from SEU without significant loss in memory speed and with minor loss in available chip area. This object is achieved by the parallel implementation of a fast asymmetric response memory latch.

The invention comprises a memory cell design that is completely immune to single event upset. It employs enhancement mode MOSFET transistors and either depletion mode MOSFET or resistors. The cell exhibits no loss in speed relative to a normal six transistor static RAM cell. In contrast to the circuit techniques, the invention herein does not attempt to prevent a single latch upset, but corrects the upset "in place" with the control latches. In this sense, our cell can not be upset even with very long transients. Also the usual circuit hardening approach requires speed penalties, in contrast to our parallel connections.

BRIEF DESCRIPTION OF THE DRAWINGS

A better understanding of the invention may be had from a consideration of the following detailed description, taken in conjunction with the accompanying drawings, in which.

DESCRIPTION OF THE INVENTION

Figure 1C:
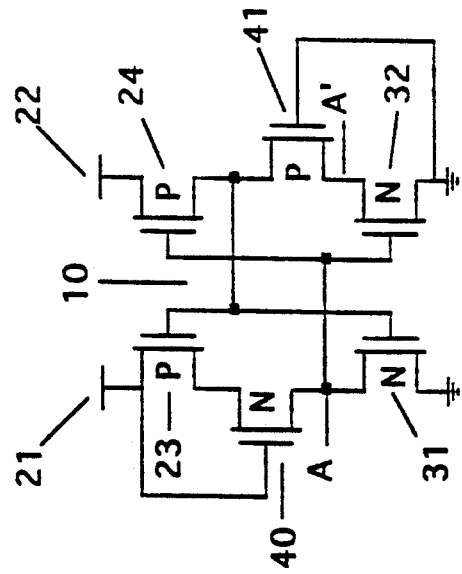
FIG. 1 illustrate three implementations of an asymmetrical latch.
Figure 1B:
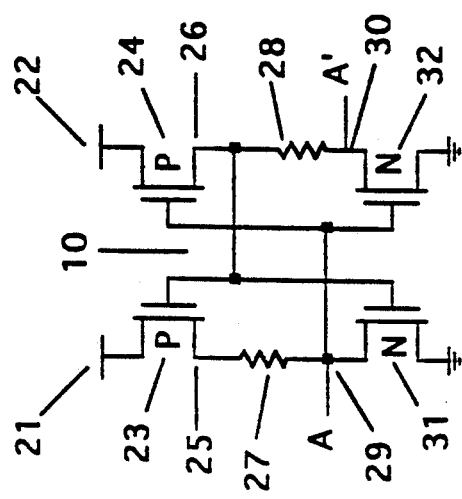
Figure 1A:
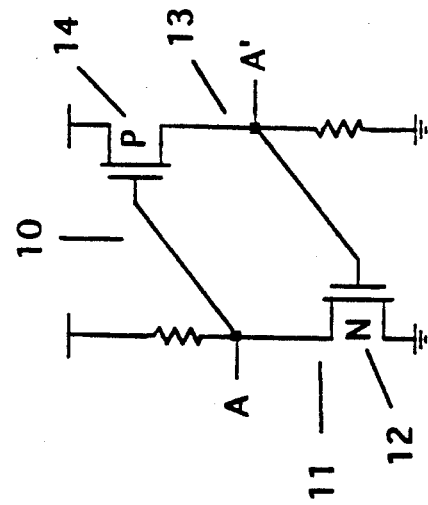

FIGS. 1A-C illustrate three examples of the asymmetric latch response of the invention. FIG. 1A illustrates the simplest example of asymmetry of the static latch or memory cell 10 using two transistor types 12, 14 so that the two logic states are generated by having both transistors 12, 14 either ON or OFF. The OFF state is "soft," i.e., the OFF state can be upset by a SEU because strikes at the OFF transistor produce current which simulate the ON or upset condition. On the other hand, the ON state is reinforced by any strike on transistors 12 and 14 because ion strikes at ON transistors simply produce more current which represents the original logic state, thereby reinforcing it. The latch 10 normally can be written into either of its two states, but will exhibit SEU from only one of the states. Operation of the asymmetric latch 10 is based on the fact that ion strikes on an n-channel source/drain 12 result in current flowing into the node 11, thereby introducing a negative voltage transient. Ion-induced current flows from a p-channel source/drain 13.

FIG. 1B is one practical design implementing the asymmetric latch 10. The latch 10 comprises two CMOS inverters 21 and 22 having preferably enhancement mode MOSFET transistors 23, 24, 31, and 32. The output of one inverter is connected to the input of the other inverter. Resistors 27, 28 are interposed between the p-channel transistor 23 and the n-channel transistor 31 of inverter 21, and between the p-channel transistor 24 and the n-channel transistor 32 of inverter 22 to protect the logic states when transistors 23 or 32 experience ion strikes. The embodiment in FIG. 1B has resistors connected in the drain lines so that in one logic state neither OFF transistor is directly connected to the information node. Protection is accomplished using a technique in which voltage transients at the feedback node 29 are divided down by the resistor 27 and the ON transistor 31 of the latch. In other words, resistors 27 and 28 protect the feedback nodes 29 and 26, respectively, from strikes at transistors 23 and 32 only when these transistors 23 and 32 are OFF. Properly designed elements will never allow the divided voltage to reach the switch point of the unstruck inverter, and ion strikes on the protected transistors are unable to upset the latch even with transients lasting 16 nanoseconds during which the struck node voltages are nearly 1 V above the power supply or below zero. This long pulse far exceeds any effects of natural ions on known CMOS technologies. Note, however, that the resistor 27 is used differently than suggested by any prior art; the resistor 27 protects the feedback node 29 from p-channel strikes on node 25 of the latch. That is, when feedback node 29 is LOW, it is protected; and when feedback node 26 is HIGH, the logic state is also protected or hardened.

However, when the transistors 31 and 24, connected to feedback nodes 29 and 26, respectively, are OFF, i.e., feedback node 29 is HIGH, and feedback node 26 is LOW, the logic state is unprotected from SEU. In this way the latch 10 is asymmetric in its response to ion strikes. Thus, only one logic state is protected with this technique of dividing voltages. Similarly, strikes on the gate of the access transistor at node 30 cause the n-channel transistor 32 to turn ON and temporarily connects the latch node 29 to a undefined bit line voltage. This is not a serious problem in present technologies because the transient is very short compared to the write-time of the latch 10, but increased integration scale could present a problem. The invention, however, accounts for possible access transistor gate strikes in our designs.

Further, we have only discussed memory cells having n-channel access transistors (not shown in FIG. 1B), always connecting to the n-type transistors 31 and 32 of the latch, where strikes on the n-channel access transistor node 29 behave exactly as strikes on the n-channel transistors 31 and 32 in the latch. Analogous arguments support the successful operation when p-type access transistors are connected to p-type latch transistors.

Transistor parameters characteristic of the AT&T 1.25 mm, radiation hardened CMOS technology were used. A 0.25 msec current transient containing varying amounts of charge was connected to each of the four labeled nodes 25, 26, 29, and 30 in FIG. 1B. For the protected state no upset was observed even using 8 picocouloumbs, a value unrealistically high for an ion strike. For the unprotected state only 0.15 picocouloumbs was required to produce upset.

FIG. 1C illustrates a CMOS latch implementing depletion mode transistors 40 and 41, preferably MOSFETs, instead of resistors between the p-channel and the n-channel transistors, between 23 and 31 and then between 24 and 32 of each inverter 21 and 22, respectively, as part of the voltage divider. At high integration scales, the implementation of the asymmetric response latch using transistors is preferred because implementation is easier when no resistors are used. Only transistor drains of a common type connect to the information node. An n-channel depletion transistor 40 protects against p-node strikes, while a p-channel depletion transistor 41 protects against n-node strikes. Consequently, strikes at the information node can upset only one logic state, i.e., HIGH-to-LOW for n-nodes and LOW-to-HIGH for p-nodes. As an example, for a silicon-on-insulator, 1.25 micrometer technology, wherein the source and body are tied together on the depletion mode transistor, setting the threshold voltages for these transistors to zero is adequate to harden the latch, but optimization depends on the specifics of a given technology and application.

Figure 2:
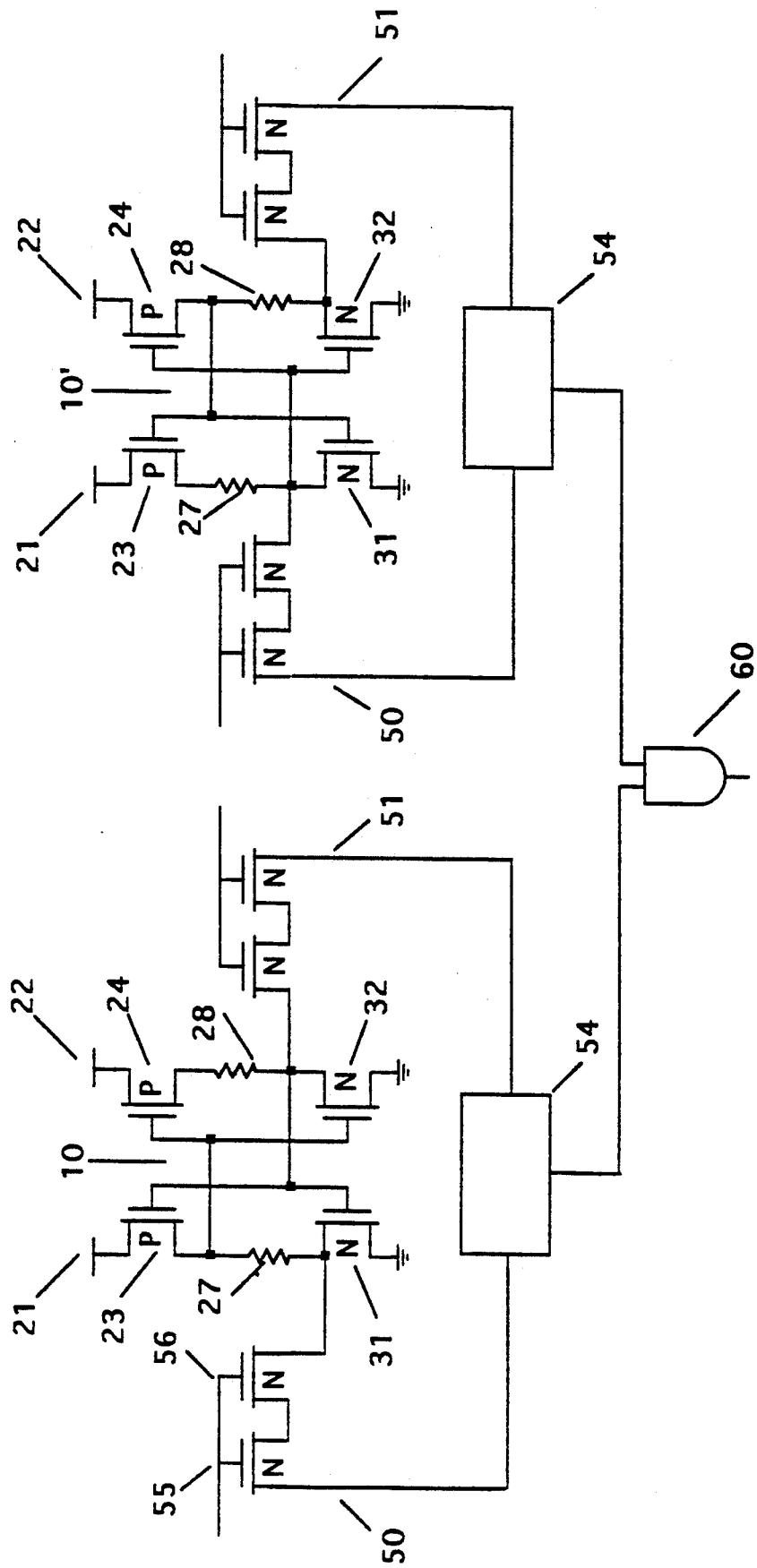
FIG. 2 is a schematic of two asymmetrical latches connected to sense amplifiers.

Note that only partial protection, i.e., protection of only one logic state, is achieved using a single asymmetric latch, but complete immunity from SEU strikes and protection of information in a memory cell is achieved by implementing two or more asymmetric response latches connected in parallel. FIG. 2 is a illustration of parallel placement of two asymmetric latches configured as in FIG. 1B. The two asymmetric latches 10, 10', complete with access lines 50 and 51, are protected by a series combination of two transistors 55 and 56. Latch 10 and 10' are redundant versions of each other, and the same logic state is hardened in each of the latches. Output from each of the latches 10, 10' is sensed independently at the end of bit lines 50 and 51 with sense amplifiers 54. The signals are fed into an AND gate 60. Because of the asymmetric response of each latch 10, 10' to an ion strike, the latches upset in only one direction, and assuming that within the memory time of the memory cell statistically only one transistor of any one inverter of the latch is hit by an ion strike, a single AND gate is sufficient to determine the correct level. If the hardened state for individual cells correspond to the logical "1", two "1"s represent a data valid "1" for the memory. But the other three combinations of "0" and "1" represent the data valid "0" state because mixed states only occur when one of the elements upsets. The switch times of the asymmetric response latch pair of 10 and 10' is comparable to a conventional latch so the memory write or read time would be negligibly different. The AND gate 60 adds a small delay for read access, but this is much smaller than the normal read time. Consequently, this configuration of a parallel arrangement of two asymmetric response latches is a very fast memory cell with complete immunity to single strikes.

Figure 3:
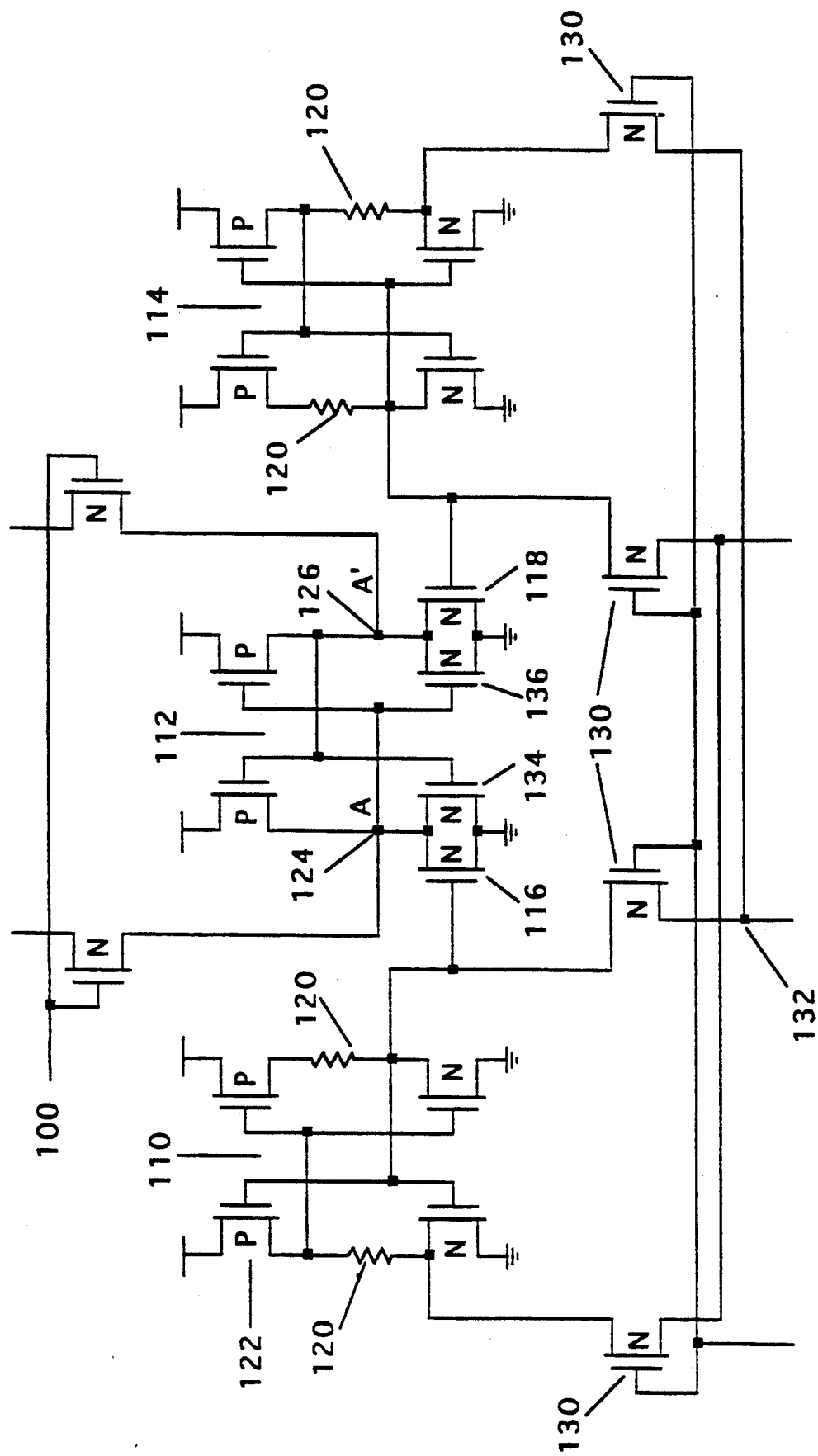
FIG. 3 is a schematic of a three latch memory cell where two asymmetrical response latches "support" the logic state of the information latch.

A second latch configuration is shown in FIG. 3 which shows a three latch memory cell 100 where information is read only from the center or information latch 112, but a logic state is written to all three latches 110, 112, 114. The two asymmetrical response latches 110 and 114 are control latches that "support" the logic state of the information latch 112. Resistors 120 are implemented into each control latch 110 and 114, just as in the asymmetric response latch of FIG. 1B, but depletion mode transistors may substitute, as in FIG. 1C. The information latch 112 contains two extra n-channel or protection transistors 116 and 118, which are in the same state, i.e., either ON or OFF, as the transistors 134 and 136 they parallel. The control latches 110 and 114 are attached to the information latch 112 at the node that only upsets from HIGH-to-LOW.

Consider separately, strikes on each of the three latches in the configuration of FIG. 3. First, an upset of the information latch 112 is restored by the ON protection transistor 116, which simply rewrites the information latch 112. If there is an ion strike having an extremely long current pulse, the cell 100 resets within a couple of gate delays following the termination of the pulse. Second, strikes upsetting the control latch 110 with its protection transistor gate 122 HIGH simply turns this transistor OFF with no effect on the information latch 112. Finally, an upset of the control latch 114 is not possible in the state shown because of its asymmetry in response to a strike. Thus, single strikes on either of the three latches 110, 112, 114 cannot produce a permanent upset of the information latch 112. Only the information latch 112 is read. In order to protect against gate strikes on the access transistors 130 of the asymmetrical latches, the access transistors 130 are connected to the information nodes 124 or 126 of the information latch 112. The bit lines 132 for the asymmetric latches are thereby "controlled" during memory. Series access transistors will also work because one is OFF when the other is struck.

When the device is fabricated with any complementary logic technology (CMOS) or conventionally scaled CMOS, it exhibits complete immunity to multiple ion strikes with negligible loss in speed. The asymmetrical response latch is preferably, but not exclusively, implemented with silicon-on-insulator technology because of the lack of body effects. The implementation is straightforward for SOI technologies, but can also be implemented on bulk CMOS. Thus, new circuit configurations provide static latches or memory cells with complete immunity from logic state upset resulting from strikes by heavy ions, i.e., single event upset (SEU) without appreciable loss in speed. Circuit speed is maintained by paralleling access to separate parts of a unit cell. The parallel organization also allows complete testing of the memory cell.

What is claimed is:

1. A bi-stable asymmetric response latch, consisting essentially of:
   (a) a first and a second inverter, each of said inverters having a p-channel transistor and a n-channel transistor, said inverters cross-coupled so that a source/drain of said n-channel transistor of said first inverter is cross-coupled to a gate of said p-channel transistor of said second inverter at a first coupling node, and a source/drain of said p-channel transistor of said second inverter is cross-coupled to a gate of said n-channel transistor of said first inverter at a second coupling node; wherein one of said inverters has a single hardened logic state and the other of said inverters has a soft logic state;
   (b) a first voltage dividing means interposed between said p-channel source/drain of said first inverter and said first cross-coupling node wherein the logic state of said first inverter can only be changed by an ion strike when the voltage level at said first coupling node is low;
   (c) a second voltage dividing means interposed between said second coupling node and a n-channel source/drain of said second inverter wherein the logic state of said second inverter can only be changed by an ion strike when the voltage level at said second coupling node is high.

2. The bi-stable asymmetric response latch of claim 1 wherein said first and second voltage dividing means are resistors.

3. The bi-stable asymmetric response latch of claim 1 wherein said p-channel and said n-channel transistors are field effect transistors, and said first and second voltage dividing means are depletion mode transistors.

4. The bi-stable asymmetric response latch of claim 3 wherein said field effect transistors are enhancement mode MOSFETs, and said depletion mode transistors are MOSFETs.

5. A logical memory cell, comprising:
   (a) a first bi-stable asymmetric response latch consisting essentially of a first and a second inverter, each of said inverters having a p-channel transistor and a n-channel transistor, said inverters cross-coupled so that a source/drain of said n-channel transistor of said first inverter is cross-coupled to a gate of said p-channel transistor of said second inverter at a first coupling node, and a source/drain of said p-channel transistor of said second inverter is cross-coupled to a gate of said n-channel transistor of said first inverter at a second coupling node wherein one of said first and second inverters has a single hardened logic state and the other of said first and second inverters has a soft logic state; a first voltage dividing means interposed between said p-channel source/drain of said first inverter and said first cross-coupling node wherein the logic state of said first inverter can only be changed by an ion strike when the voltage level at said first coupling node is low; a second voltage dividing means interposed between said second coupling node and a n-channel transistor of said second inverter wherein the logic state of said second inverter can only be changed by an ion strike when the voltage level at said second coupling node is high; a first bit line connected at a first information node to said first inverter between said first n-channel transistor and said first coupling node; and a second bit line connect at a second information node to said second inverter between said second n-channel transistor and said second voltage dividing means;

(b) a second bi-stable asymmetric response latch consisting essentially a third and a fourth inverter, each of said inverters having a p-channel transistor and a n-channel transistor, said inverters cross-coupled so that a source/drain of said n-channel transistor of said third inverter is cross-coupled to a gate of said p-channel transistor of said fourth inverter at a third coupling node, and a source/drain of said p-channel transistor of said fourth inverter is cross-coupled to a gate of said n-channel transistor of said third inverter at a fourth coupling node wherein one of said third and fourth inverters has a single hardened logic state and the other of said third and fourth inverters has a soft logic state; a third voltage dividing means interposed between said p-channel source/drain of said third inverter and said third cross-coupling node wherein the logic state of said third inverter can only be changed by an ion strike when the voltage level at said third coupling node is low; a fourth voltage dividing means interposed between said fourth coupling node and a n-channel transistor of said fourth inverter wherein the logic state of said fourth inverter can only be changed by an ion strike when the voltage level at said fourth coupling node is high; a third bit line connected at a third information node to said third inverter between said third n-channel transistor and third coupling node; and a fourth bit line connected at a fourth information node to said fourth inverter between said fourth n-channel transistor and said fourth voltage dividing means;

(c) a first sensing means connected between said first and second bit lines to detect the state of said first and second information nodes;

(d) a second sensing means connected between said third and forth bit lines to detect the state of said third and fourth information nodes;

(e) an AND gate connected to receive outputs of said first and second sensing means to compare data on said first and second sensing means.

6. The logical memory cell of claim 5 wherein said p-channel and said n-channel transistors are field effect transistors, and said first and second voltage dividing means are resistors.

7. The logical memory cell of claim 5 wherein said p-channel and said n-channel transistors are field effect transistors, and said first and second voltage dividing means are depletion mode transistors.

8. The logical memory cell of claim 7 wherein said field effect transistors are enhancement mode MOSFETs, and said depletion mode transistors are MOSFETs.

9. A logical memory cell, comprising:

(a) a first and second asymmetrical response latch;

(b) an information latch, connected in parallel with and interposed between said first and second asymmetrical response latches, said information latch further comprising two transistors which are of the same type as, and are parallel to, transistors connected to an information node;

(c) a plurality of bit lines connected to said information latch to provide data input control;

(d) access transistors connected to said information latch on a plurality of output lines; wherein said control latches protect logical information hardened into said information latch.

* * * * *